United States Patent
Park et al.

(10) Patent No.: US 10,755,991 B2
(45) Date of Patent: Aug. 25, 2020

(54) FOLDABLE DISPLAY DEVICE

(71) Applicant: LG Display Co., Ltd., Seoul (KR)

(72) Inventors: Youngjoo Park, Busan (KR); Sejin Jang, Paju-si (KR); YuLim Won, Incheon (KR); KyungHwan Oh, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/530,634

(22) Filed: Aug. 2, 2019

(65) Prior Publication Data

US 2020/0051881 A1 Feb. 13, 2020

(30) Foreign Application Priority Data

Aug. 13, 2018 (KR) .................. 10-2018-0094531

(51) Int. Cl.
*H01L 23/13* (2006.01)
*H01L 27/12* (2006.01)

(52) U.S. Cl.
CPC .......... *H01L 23/13* (2013.01); *H01L 27/1218* (2013.01)

(58) Field of Classification Search
None
See application file for complete search history.

(56) References Cited

U.S. PATENT DOCUMENTS

| 9,660,216 | B2 | 5/2017 | Lee et al. | |
|---|---|---|---|---|
| 10,342,120 | B2* | 7/2019 | Park | G02F 1/133305 |
| 2004/0004434 | A1* | 1/2004 | Nishi | H01L 51/5221 |
| | | | | 313/506 |
| 2006/0087865 | A1* | 4/2006 | Ha | G02B 5/0278 |
| | | | | 362/607 |
| 2014/0091288 | A1* | 4/2014 | Lee | H01L 51/5256 |
| | | | | 257/40 |
| 2016/0111678 | A1* | 4/2016 | Lee | C09J 9/00 |
| | | | | 257/40 |
| 2016/0268542 | A1* | 9/2016 | Suzuki | H01L 51/5212 |
| 2016/0293886 | A1* | 10/2016 | Yu | H01L 51/5253 |
| 2016/0380033 | A1* | 12/2016 | Lee | G06F 1/1652 |
| | | | | 257/40 |
| 2017/0153668 | A1* | 6/2017 | Jang | G06F 1/1641 |
| 2017/0166786 | A1* | 6/2017 | Moon | C09J 4/06 |
| 2017/0229665 | A1* | 8/2017 | Park | H01L 51/5253 |
| 2017/0321087 | A1* | 11/2017 | Moon | C09D 11/40 |
| 2018/0187051 | A1* | 7/2018 | Won | C09J 7/385 |
| 2018/0350890 | A1* | 12/2018 | Jeong | H01L 51/5253 |

FOREIGN PATENT DOCUMENTS

| KR | 10-2012-0034506 A | 4/2012 |
|---|---|---|
| KR | 10-2016-0047035 A | 5/2016 |
| KR | 10-2016-0141263 A | 12/2016 |

* cited by examiner

*Primary Examiner* — Xanthia C Cunningham
(74) *Attorney, Agent, or Firm* — Fenwick & West LLP

(57) ABSTRACT

A foldable display device is disclosed. The foldable display device includes a display panel including a folding area and a non-folding area, a back plate unit, and a plurality of adhesive layers disposed between the display panel and the back plate unit and between the back plate units. Some of the plurality of adhesive layers includes a first adhesive part and a second adhesive part having different adhesiveness. Therefore, an adhesiveness of the plurality of adhesive layers is controlled to reduce the stress generated at the time of folding the foldable display device.

20 Claims, 10 Drawing Sheets

FOLDABLE DISPLAY DEVICE

CROSS-REFERENCE TO RELATED APPLICATIONS

This application claims the priority of Republic of Korea Patent Application No. 10-2018-0094531 filed on Aug. 13, 2018, the disclosure of which is incorporated by reference in its entirety.

TECHNICAL FIELD

The present disclosure relates to a foldable display device, and more particularly, to a foldable display device in which a rigidity of a flexible foldable display device can be improved.

BACKGROUND

As display devices which are used for a monitor of a computer, a television, or a cellular phone, there are an electroluminescent display device which is a self-emitting device and a liquid crystal display device (LCD) which requires a separate light source.

An applicable range of the display device is diversified to personal digital assistants as well as monitors of computers and televisions and a display device with a large display area and a reduced volume and weight is being studied.

Further, recently, a foldable display device which forms a display unit and wiring lines on a flexible substrate to be freely folded or unfolded is attracting an attention as a next generation display device.

SUMMARY

Configurations of a foldable display device in which an active area is foldable may be formed to have a very thin thickness to be foldable. For example, in the foldable display device in which the active area is foldable, a cover window may be formed of a plastic film having a very thin thickness. However, when the cover window is formed of a plastic film, and the like having a very thin thickness to be foldable, the cover window may be deformed by the external impact and a flatness of the cover window may be degraded. Therefore, a method for improving the flatness of the cover window were necessary without increasing the thickness of the cover window is disclosed.

When a rigid structure, for example, at least one back plate unit and/or a frame including a rigid material is disposed below the foldable display panel in the active area, the flatness of the cover window was improved. However, when a rigid structure is introduced below the display panel, if the foldable display device was folded, stress was caused from the rigid structure, which resulted in a damage of the other configuration of the foldable display device.

Therefore, a foldable display device which disposes a rigid structure to improve the flatness of the cover window and reduces a stress in accordance with the rigid structure is disclosed.

Another object to be achieved by the present disclosure is to provide a foldable display device which increases rigidity.

Another object to be achieved by the present disclosure is to provide a foldable display device in which the damage caused by the folding may be reduced.

Still another object to be achieved by the present disclosure is to provide a foldable display device which reduces the stress from the rigid material at the time of folding from being transmitted to the other configuration of the foldable display device.

Objects of the present disclosure are not limited to the above-mentioned objects, and other objects, which are not mentioned above, can be clearly understood by those skilled in the art from the following descriptions.

According to an aspect of the present disclosure, a foldable display device includes: a display panel including a folding area and a non-folding area, the display panel configured to fold in the folding area and not configured to fold in the non-folding area; a back plate unit comprising a plurality of back plates, the back plate unit disposed under the display panel; and a plurality of adhesive layers disposed between the display panel and the back plate unit, and between the plurality of back plates, wherein at least some of the plurality of adhesive layers includes a first adhesive part and a second adhesive part, the second adhesive part less adhesive than the first adhesive part. Therefore, an adhesiveness of at least some adhesive layer among the plurality of adhesive layers is controlled to reduce the stress generated at the time of folding the foldable display device.

According to another aspect of the present disclosure, a foldable display device includes: a display panel which is capable of being folded with respect to a folding axis, a back plate unit disposed on one surface of the display panel, the back plate unit comprising a plurality of back plates, a frame disposed on one surface of the back plate unit, and a plurality of adhesive layers disposed between the display panel and the back plate unit, between the plurality of back plates, and between the back plate unit and the frame, in which an adhesiveness at an edge portion of the plurality of adhesive layers is weaker than an adhesiveness at a center portion to facilitate the respective slipping of the back plate unit and the frame caused by the folding of the folding area. Therefore, the adhesiveness of the edge part of the plurality of adhesive layers is controlled to minimize the propagation of the stress generated in the back plate unit and the frame at the time of folding the folding area to the other components.

According to another aspect of the present disclosure, a foldable display device, comprises: a display panel configured to be folded with respect to a folding axis; a back plate unit disposed on the display panel, the back plate unit comprising a plurality of back plates; a frame disposed on the back plate unit; and a plurality of adhesive layers disposed between the display panel and the back plate unit, between the plurality of back plates, and between the back plate unit and the frame, wherein an adhesiveness at an edge portion of the plurality of adhesive layers is less adhesive than an adhesiveness of a portion of the plurality of adhesive layers at the folding axis.

In one embodiment, a foldable display device, comprises: a display panel including a folding area and a non-folding area, the display panel configured to fold in the folding area and not configured to fold in the non-folding area; a back plate unit below the display panel; and one or more adhesive layers disposed between the display panel and the back plate unit, wherein at least some of the one or more adhesive layers include a first adhesive part and a second adhesive part, the second adhesive part less adhesive than the first adhesive part.

Other detailed matters of the exemplary embodiments are included in the detailed description and the drawings.

According to the present disclosure, in a foldable display device in which an active area is foldable, a rigid structure which supports the foldable display device is added to improve a rigidity of the foldable display device.

According to another exemplary embodiment of the present disclosure, a rigid structure which supports the foldable display device is added to improve the squashing of a surface of the foldable display device having a thin thickness.

According to another exemplary embodiment of the present disclosure, a stress which is applied to the foldable display device at the time of being folded is controlled to minimize the damage of the foldable display device.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
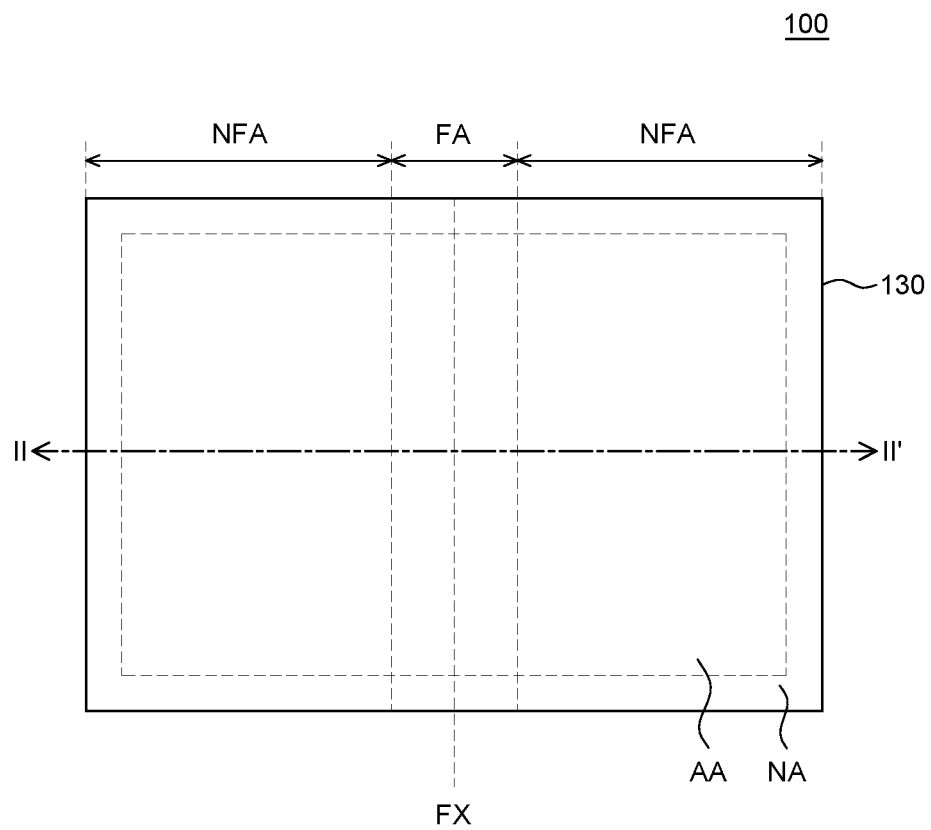
FIG. 1 is a plan view of a foldable display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the terms "consisting of" or "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a foldable display device according to exemplary embodiments of the present disclosure will be described in detail with reference to accompanying drawings.

Figure 2:
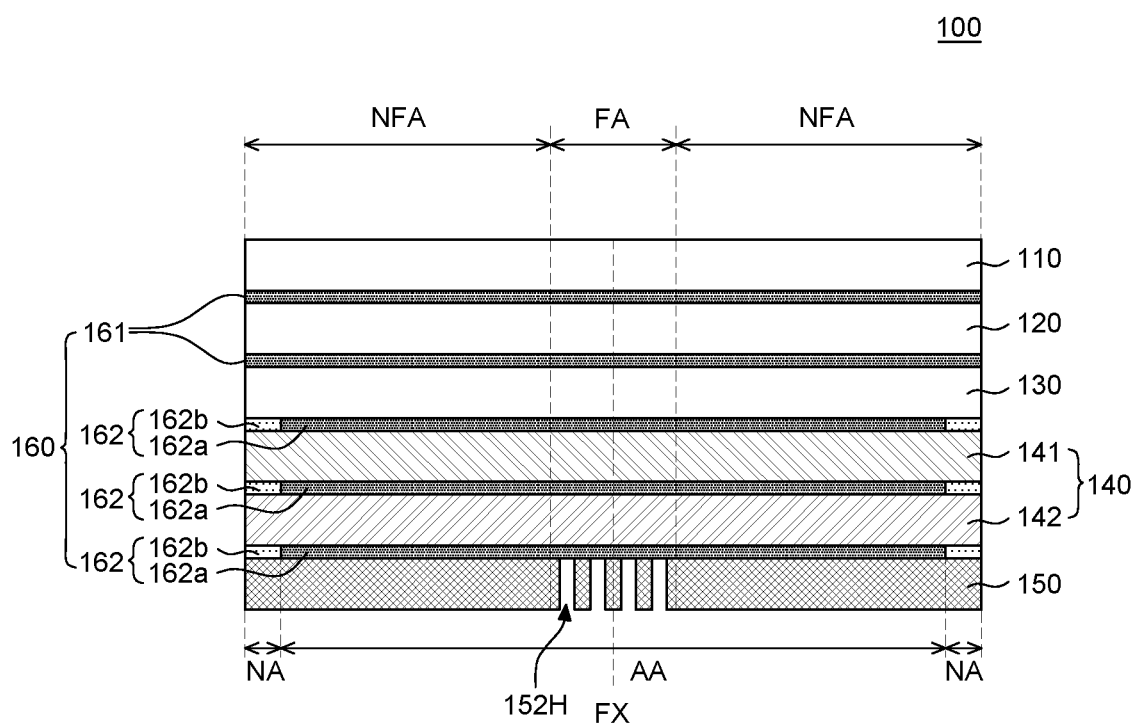
FIG. 2 is a cross-sectional view taken along the line II-II' of FIG. 1 according to an exemplary embodiment.
Figure 3:
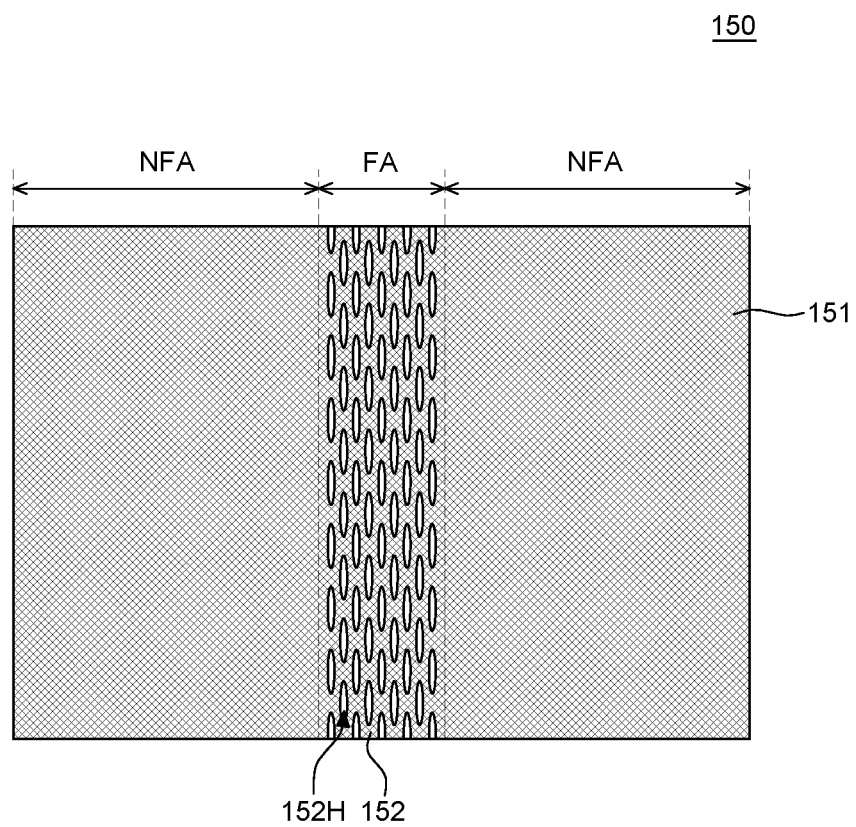
FIG. 3 is a plan view of a frame of a foldable display device according to an exemplary embodiment of the present disclosure.

FIG. 1 is a plan view of a foldable display device according to an exemplary embodiment. FIG. 2 is a cross-sectional view taken along the line II-II' of FIG. 1. FIG. 3 is a plan view of a frame of a foldable display device according to an exemplary embodiment of the present disclosure. Referring to FIGS. 1 to 3, a foldable display device 100 according to an exemplary embodiment of the present disclosure at least includes a back plate unit 140, a frame 150, and an adhesive unit 160 which includes a second adhesive unit 162 including different areas with different adhesiveness. The adhesive unit 160 includes a plurality of adhesive layers.

A foldable display device 100 according to another exemplary embodiment of the present disclosure includes a back plate unit 140, a frame 150, and an adhesive unit 160 which includes a second adhesive unit 162 including different areas with different adhesiveness. The foldable display device 100 according to another exemplary embodiment of the present disclosure further includes a cover window 110, a polarizer 120, and a first adhesive unit 161 including areas having the same adhesiveness. In other words, the adhesiveness of the whole area of the first adhesive unit 161 may be the same. The adhesive unit 160 includes a plurality of adhesive layers.

The display panel 130 is a panel in which images are implemented. Display elements for implementing images, and circuits, wiring lines, components, and the like for driving the display elements may be disposed in the display panel 130.

The display panel 130 includes an active area AA and a non-active area NA. Further, the display panel 130 includes a folding area FA and a non-folding area NFA. That is, in the display panel 130, areas may be divided depending on whether it can display images and areas may also be divided depending on whether it is foldable. That is, a specific area of the display panel 130 may be defined depending on whether it can display images and it is foldable. For example, a specific area of the display panel 130 may be simultaneously an active area AA and a folding area FA.

The active area AA is an area where images are displayed and display elements for displaying images and circuit units for driving the display elements may be disposed therein. For example, when the foldable display device 100 is an electroluminescent display device, the display element may include an electroluminescent element. For example, when the foldable display device 100 is a liquid crystal display device, the display element may include a liquid crystal element. Hereinafter, for the convenience of description, it is assumed that the foldable display device 100 according to various exemplary embodiments of the present disclosure is a foldable display device 100 including an electroluminescent element, but the present disclosure is not limited thereto.

The circuit units may include various thin film transistors, capacitors, wiring lines, and the like for driving the electroluminescent elements. For example, the circuit units may include various configurations such as a driving thin film transistor, a switching thin film transistor, a storage capacitor, a gate line, and a data line, but are not limited thereto.

In the non-active area NA, the images are not displayed and circuits, wiring lines, components, and the like for driving the display elements of the active area AA are disposed. In the non-active area NA, driving circuits such as a gate driver integrated circuit (IC) or a data driver IC may be disposed. For example, the driving circuit may be mounted in the non-active area NA of the display panel 130 by a gate in panel (GIP) or connected to the display panel 130 by a tape carrier package (TCP), a chip on film (COF) manner, or the like.

The non-active area NA may be defined as an area which encloses (e.g., surrounds) the active area AA as illustrated in FIG. 1. However, the non-active area NA may also be defined as an area extending from the active area AA or defined as an area where the display element is not disposed, but is not limited thereto.

In the meantime, the display panel 130 may be defined as an active area AA and a non-active area NA or defined as a folding area FA and a non-folding area NFA.

The folding area FA is an area in which the display panel 130 is folded with respect to a folding axis FX and is folded with a specific radius of curvature when the display panel 130 is folded. The folding area FA may include a part of the active area AA and a part of the non-active area NA. In FIG. 1, even though it is illustrated that the folding axis FX is disposed at the center of the display panel 130, the position of the folding axis FX may vary to various positions and the folding area FA may also vary depending on the position of the folding axis FX, but is not limited thereto.

In the non-folding area NFA, the display panel 130 maintains a flat state. The non-folding area NFA may include a part of the active area AA and a part of the non-active area NA. The non-folding area NFA is an area extending to both sides of the folding area FA. That is, the non-folding areas NFA may be defined with the folding area FA therebetween. Further, when the foldable display device 100 is folded, the non-folding areas NFA at both sides of the folding area FA may be disposed to be opposite to each other.

Referring to FIG. 2, the back plate unit 140 is disposed below the display panel 130 of the foldable display device 100 according to the exemplary embodiment of the present disclosure. The back plate unit 140 includes a plurality of back plates. When the substrate of the display panel 130 is formed of a plastic material such as polyimide (PI), the manufacturing process of the display device 100 is performed under a situation that a support substrate is disposed below the substrate of the display panel 130. The support substrate may be glass and generally, may be a mother glass. After forming various components on the display panel 130, the display panel 130 may be separated from the support substrate. However, after separating the support substrate, the back plate unit 140 for supporting the substrate of the display panel 130 may be disposed below the substrate.

Additionally, the back plate unit 140 not only supports the display panel 130, but also protects the display panel 130 from moisture, heat, impact, and the like from the outside.

In the meantime, in some embodiments of the present disclosure, the back plate unit 140 may include a first back plate 141 and a second back plate 142 which has a different property from the first back plate 141. The first back plate 141 is disposed below the display panel 130 and the second back plate 142 is disposed below the first back plate 141. As the back plate unit 140 is formed by a multi-layered structure of the first back plate 141 and the second back plate 142, the rigidity and the impact resistance of the foldable display device 100 may be improved. Specifically, at least one of the back plate units 140 is formed of a rigid material to improve the rigidity and/or the impact resistance of the foldable display device 100. In the meantime, the first back plate 141 and the second back plate 142 may be formed of different materials and have different Young's modulus. At least one of the first back plate 141 and the second back plate 142 may include a rigid material having a Young's modulus of 10 Gpa or higher. For example, each of the first back plate 141 and the second back plate 142 may be formed of one of a plastic material having a Young's modulus of 2 Gpa to 10 Gpa such as polycarbonate (PC) or polyimide (PI), a soft material having a Young's modulus of 2 Gpa or lower, such as silicon (Si) or polyurethane (PU), or a rigid material having a Young's modulus of 10 Gpa or higher, such as glass or metal, but is not limited thereto.

For example, one of the first back plate 141 and the second back plate 142 may be formed of a plastic material or a soft material, and the other one may be formed of a rigid material. Further, as described above, one of the first back plate 141 and the second back plate 142 which is formed of the rigid material may improve the rigidity and/or the impact resistance of the foldable display device 100. Referring to FIG. 2, the frame 150 is disposed below the back plate unit 140. The frame 150 may protect and support the back plate unit 140 and the display panel 130 which are disposed on the frame 150. For example, the frame 150 may be formed of a rigid material such as metal, but is not limited thereto.

The foldable display device 100 according to another exemplary embodiment of the present disclosure may further include a first adhesive unit 161, a cover window 110, and a polarizer 120 which are disposed on the display panel 130.

FIG. 2 illustrates an unfolded state, that is, a flat state. Therefore, positions of edges of components illustrated in FIG. 2 may be defined as "initial positions".

Specifically, when the foldable display device 100 is in a flat state, the position of the edge of each component of the foldable display device 100 may be determined as an "initial position". If all the positions of the edges of the components of the foldable display device 100 in the flat state are the same, edges may overlap each other. If the positions of the edges of the components of the foldable display device 100 in the flat state are partially different, edges may not overlap each other.

Hereinafter, for the convenience of description, the edges of components of the foldable display device 100 in the flat state are defined as "initial positions".

Referring to FIG. 3, the frame 150 includes a support unit 151 and a folding unit 152. The support unit 151 is an area where the flat state is maintained so that the support unit 151 is included in the non-folding area NFA.

The folding unit 152 is a flexible area to be included in the folding area FA. When the foldable display device 100 is folded, the folding unit 152 has a foldable property so that the folding unit 152 may be folded. Making reference to FIG. 3, the plurality of openings 152H of the folding unit 152 may have ellipse shape in a plan view, which further facilitates the foldable property of the folding unit 152. However, the embodiments of the present invention are not limited thereto.

A plurality of openings 152H may be disposed in the folding unit 152. The folding unit 152 of the frame 150 may have a bendable property by the plurality of openings 152H. Therefore, as the plurality of openings 152H is disposed, the folding unit 152 of the frame 150 may be easily folded.

In the meantime, even though in FIG. 2, it is illustrated that the plurality of openings 152H is disposed only in the folding unit 152 of the frame 150, the plurality of openings 152H may also be disposed in the support unit 151. That is, as long as the frame 150 supports and protects the display panel 130, a shape of the frame 150 is not limited thereto.

Referring to FIG. 2, the adhesive unit 160 is disposed between the other components of the foldable display device 100 to bond each component to another component. Specifically, the adhesive layers of the adhesive unit 160 may be disposed between the cover window 110 and the polarizer 120, between the polarizer 120 and the display panel 130, between the display panel 130 and the first back plate 141, between the first back plate 141 and the second back plate 142, and between the second back plate 142 and the frame 150, respectively. The number of adhesive layers included in the adhesive unit 160 according to exemplary embodiments of the present disclosure is not limited and the number of adhesive layers of the adhesive unit 160 may be determined depending on components required to be bonded. For example, the adhesive unit 160 may be formed of an optical clear adhesive (OCA), a pressure sensitive adhesive (PSA), or the like, but is not limited thereto.

The adhesive unit 160 of the foldable display device 100 according to one exemplary embodiment of the present disclosure includes at least a second adhesive unit 162.

The second adhesive unit 162 refers to adhesive layers disposed below the display panel 130. Specifically, the second adhesive unit 162 includes adhesive layers which may be disposed between the display panel 130 and the first back plate 141 below the display panel 130, between the first back plate 141 and the second back plate 142, and between the second back plate 142 and the frame 150.

The adhesive layers of the second adhesive unit 162 includes a first part 162a (e.g., a first adhesive part) and a second part 162b (e.g., a second adhesive part) that is less adhesive than the first part 162a. That is, the adhesiveness of the second adhesive unit 162 may vary depending on the position of the second adhesive unit 162. The second adhesive unit 162 includes the first part 162a and the second part 162b which are configured to reduce a folding stress generated in the back plate unit 140 and the frame 150 and have different adhesivenesses.

Hereinafter, the first part 162a and the second part 162b of the second adhesive unit 162 will be described in more detail with reference to FIG. 4.

Figure 4:
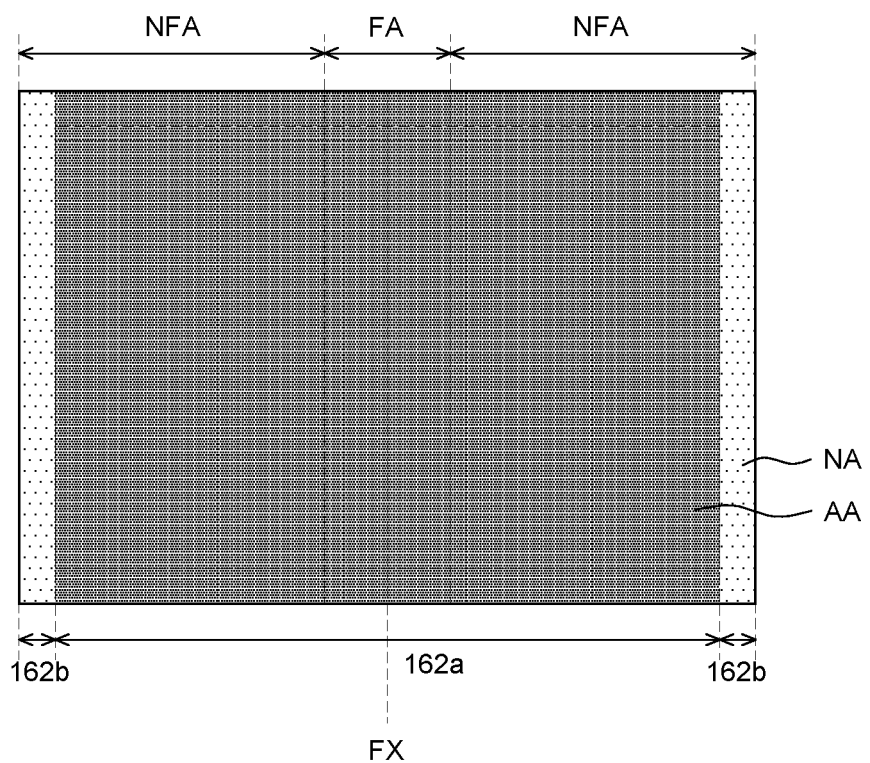
FIG. 4 is a plan view of a second adhesive unit of a foldable display device according to an exemplary embodiment.

FIG. 4 is a plan view of a second adhesive unit of a foldable display device according to an exemplary embodiment and another exemplary embodiment of the present disclosure.

Referring to FIG. 4, the first part 162a of the second adhesive unit 162 overlaps the folding area FA and a part of the non-folding area NFA which is adjacent to the folding area FA. The first part 162a may overlap a part of the active area AA and a part of the non-active area NA.

The second part 162b of the second adhesive unit 162 is disposed in the vicinity of the first part 162a. The second part 162b may be disposed in at least a part of the remaining area excluding the first part 162a from the non-folding area NFA.

The second part 162b includes an edge pattern. A long side of the edge pattern which is a second part 162b extends to be parallel to the folding axis FX of the folding area FA. In this case, the edge pattern of the second part 162b is disposed in the vicinity of the edge of the non-folding area NFA which is parallel to the folding axis FX.

The edge pattern of the second part 162b may be an area extending to both sides of the first part 162a. Therefore, the first part 162a may be disposed between the second parts 162b of the second adhesive unit 162.

The first part 162a and the second part 162b of the second adhesive unit 162 may have different wettability and cross-linking densities. For example, the stronger the adhesiveness of the adhesive layer, the higher the wettability and the lower the cross-linking density. Further, the first part 162a has a stronger adhesiveness, a higher wettability, and a lower cross-linking density than those of the second part 162b. The second part 162b has a weaker adhesiveness, a lower wettability, and a higher cross-linking density than those of the first part 162a.

An area of the first part 162a may be larger than an area of the second part 162b. As compared with the second part 162b, the first part 162a has a relatively strong adhesiveness and may fix the components above and below the second adhesive unit 162 so as not to be detached from each other when the foldable display device 100 is folded. In this case, if the area of the second part 162b having a weaker adhesiveness than that of the first part 162a is larger than the area of the first part 162a, when the foldable display device 100 is folded, there may be a problem with the components above and below the second adhesive unit 162 to be separated. Therefore, in the foldable display device 100, the area of the first part 162a of the second adhesive unit 162 may be configured to be larger than the area of the second part 162b. Therefore, when the foldable display device 100 is folded, the components above and below the second adhesive unit 162 may not be separated.

In order to weaken the adhesiveness of the second part 162b relatively as compared with the first part 162a, an additional configuration or an additional process may be further provided for the second part 162b. For example, when the second adhesive unit 162 is formed of the OCA, an additive is added to control the adhesiveness. For example, an additive which generates a thermal, UV, optical, or chemical reaction may be mixed to the second adhesive unit 162. Therefore, an additional process is performed only in the second part 162b to control a physical property of the second part 162b. Therefore, even though the first part 162a and the second part 162b are formed of the same material, the adhesiveness of the first part 162a and the second part 162b may vary by the additive. That is, the adhesive layer corresponding to the second part 162b of the second adhesive unit 162 may be configured to include an additive which generates a thermal, UV, optical, or chemical reaction, but is not limited thereto.

For example, the second adhesive unit 162 may be formed of an acrylic-based resin, a poly (meth) acrylate-based resin, a vinyl resin, a styrene resin, an ester-based resin, a rubber-based resin, an epoxy-based resin, a polyimide resin, a polyamide resin, a phenoxy resin, a polyurethane resin, or the like, but is not limited thereto.

When the second adhesive unit 162 reacts with the UV, the above-described material of the second adhesive unit 162 may further include an additive such as a photoinitiator which reacts with the UV. For example, the photoinitiator which reacts with the UV may include at least one selected from the group consisting of Iracure #184 or Iracure #189 of BASF AG, a 2,4,6-trimethylbenzoyldiphenyl-phosphineoxide (TPO) based compound, an acryl phosphine based compound, and a combination thereof, but is not limited thereto.

When the UV is irradiated to the second adhesive unit 162 including the photoinitiator, the photoinitiator may generate radicals to initiate a polymerization reaction of the material of the second adhesive unit 162 and improve the cross-linking density of the second adhesive unit 162. Therefore, the UV is additionally irradiated only to the second part 162b of the second adhesive unit 162 to improve the cross-linking density of the second part 162b and weaken the adhesiveness of the second part 162b to be weaker than that of the first part 162a.

In the meantime, when the second adhesive unit 162 reacts with the heat, the second adhesive unit 162 may further include an additive such as a heat curing agent which reacts with the heat. For example, the heat curing agent which reacts with the heat may include at least one selected from the group consisting of an NCO based curing agent such as MFA-75x and MHG-80B of Asahi Kasei, an epoxy-based curing agent, an aziridine based curing agent, a Zn chelate which is a chelate curing agent, and a combination thereof, but is not limited thereto.

When the second adhesive unit 162 including the heat curing agent is heated, the material which forms the second adhesive unit 162 is cured to improve the cross-linking density. Therefore, the second part 162b of the second adhesive unit 162 is further heated to improve the cross-linking density of the second part 162b and weaken the adhesiveness of the second part 162b to be weaker than that of the first part 162a.

The foldable display device 100 according to one exemplary embodiment of the present disclosure may be in-folded and/or out-folded. When the foldable display device 100 is in-folded, the foldable display device 100 may be folded such that upper surfaces of the cover window 110 respectively overlapping the non-folding area NFA at both sides of the folding area FA face each other. When the foldable display device 100 does not include the cover window 110 and the polarizer 120, the foldable display device 100 may be in-folded such that the active areas AA of the display panel 130 may face each other.

When the foldable display device 100 is out-folded, the foldable display device 100 may be folded such that lower surfaces of the frame 150 respectively overlapping the non-folding area NFA at both sides of the folding area FA face each other. In other words, the foldable display device 100 may be folded such that the lower surfaces of the display panel 130 face each other.

In the meantime, when the foldable display device 100 is folded, components of the foldable display device 100 slip with respect to each other so that edges of the components of the foldable display device 100 do not overlap or are spaced apart from each other. Therefore, since the components of the foldable display device 100 slip, the stress generated at the time of folding may be relieved.

In this case, adhesive layers of the adhesive unit 160 disposed between the components of the foldable display device 100 may vary depending on a protruding degree of edges of the components and a slipping degree of the edges of the components of the foldable display device 100 may also vary depending on the property of the adhesive unit 160 such as a hardness or an adhesiveness. For example, as the hardness or the adhesiveness of the adhesive unit 160 are increased, the slipping degree of the components of the foldable display device 100 may be reduced by the adhesive unit 160.

Hereinafter, an in-folded state and an out-folded state of the foldable display device 100 according to one exemplary embodiment and another exemplary embodiment of the present disclosure and an effect of relieving the stress generated at the time of folding due to the adhesive unit 160 will be described in more detail with reference to FIGS. 5A and 5B.

Figure 5A:
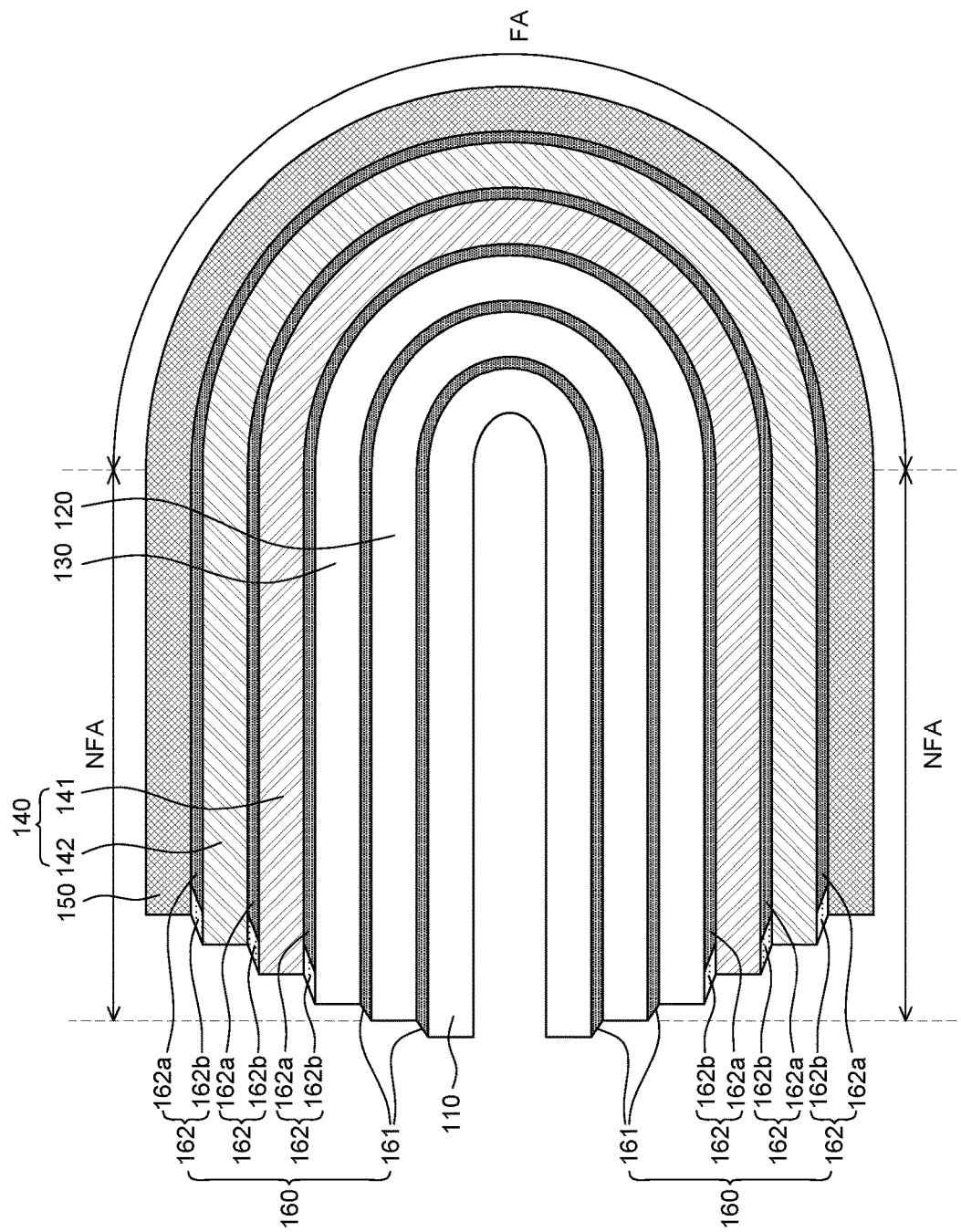
FIG. 5A is a cross-sectional view of an in-folded foldable display device according to an exemplary embodiment.

FIG. 5A is a cross-sectional view of an in-folded foldable display device according to an exemplary embodiment and another exemplary embodiment of the present disclosure. FIG. 5B is a cross-sectional view of an out-folded foldable display device according to an exemplary embodiment and another exemplary embodiment of the present disclosure.

First, referring to FIG. 5A, when the foldable display device 100 is in-folded, the components of the foldable display device 100 slip so that the positions of the edges of the components of the foldable display device 100 may move.

For the convenience of description, in FIG. 5A, it is assumed and described that the foldable display device 100 is in a flat state and edges of the components are aligned to be vertical to each other, but is not limited thereto. Also, when the foldable display device 100 is in a flat state, the position of the edge of each component of the foldable display device 100 is defined as an "initial position", but is not limited thereto.

Hereinafter, for the convenience of description, when the foldable display device is folded, the components of the foldable display device 100 which are folded to face each other are defined as undermost parts.

When the foldable display device 100 according to one exemplary embodiment of the present disclosure is folded, the edge of the first back plate 141 disposed on the display panel 130 may slide inwardly more than the edge of the display panel 130 by the stress applied by the folding. The edge of the second back plate 142 disposed on the first back plate 141 may slide inwardly more than the edge of the first back plate 141. The edge of the frame 150 disposed on the second back plate 142 may slide inwardly more than the edge of the second back plate 142. Additionally, when the foldable display device 100 is folded, radii of curvature of the components may vary. For example, at the time of folding, a radius of curvature of a component disposed at the uppermost portion is larger than a radius of curvature of a component disposed at the undermost part. Further, in the case of the component having a relatively larger radius of curvature, the slipping degree of the edge may be increased. That is, the sliding degree of the edge of the component is gradually increased from the undermost portion to the uppermost portion.

Therefore, when the foldable display device 100 according to one exemplary embodiment of the present disclosure is in-folded, the sliding degree of the edge is increased from the display panel 130 of the foldable display device 100 to the frame 150.

When the foldable display device 100 according to another exemplary embodiment of the present disclosure is folded, the edge of the cover window 110 is disposed at the outermost side and the edge of other component disposed on the cover window 110 may move, that is, slip inwardly more than the edge of the cover window 110.

The edge of the polarizer 120 disposed on the cover window 110 may slide inwardly more than the edge of the cover window 110. The edge of the display panel 130 disposed on the polarizer 120 may slide inwardly more than the edge of the polarizer 120. Therefore, when the foldable display device 100 is in-folded, the sliding degree of the edge may be increased from the cover window 110 of the foldable display device 100 to the frame 150 of the foldable display device 100.

Figure 5B:
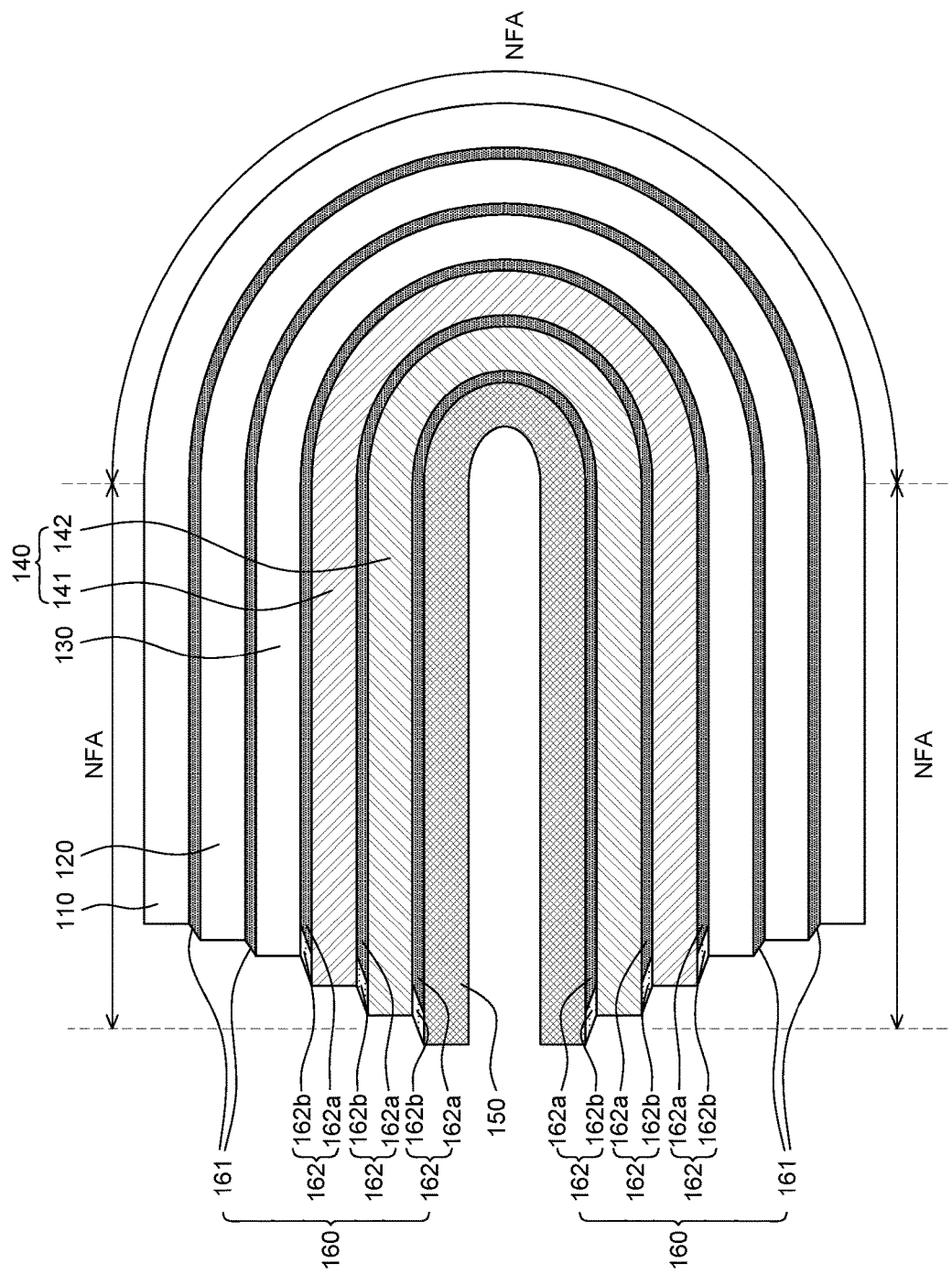
FIG. 5B is a cross-sectional view of an out-folded foldable display device according to an exemplary embodiment.

Referring to FIG. 5B, similarly, when the foldable display device 100 is out-folded, the components of the foldable display device 100 slip so that the edges of the components of the foldable display device 100 may move. For the convenience of description, when the foldable display device 100 is in a flat state, the position of the edge of each component of the foldable display device 100 is defined as an "initial position", but is not limited thereto.

When the foldable display device 100 is folded, the edge of the frame 150 is disposed at the outermost side by the stress applied by the folding. The edge of the other component disposed on the frame 150 moves inwardly more than the edge of the frame 150.

For example, the edge of the second back plate 142 disposed on the frame 150 may slide inwardly more than the edge of the frame 150. The edge of the first back plate 141 disposed on the second back plate 142 may slide inwardly more than the edge of the second back plate 142. The edge of the display panel 130 disposed on the first back plate 141 may slide inwardly more than the edge of the first back plate 141. The edge of the polarizer 120 disposed on the display panel 130 may slide inwardly more than the edge of the display panel 130. The edge of the cover window 110 disposed on the polarizer 120 may slide inwardly more than the edge of the polarizer 120. Therefore, when the foldable display device 100 is out-folded, the sliding degree of the edge may be increased from the frame 150 of the foldable display device 100 to the cover window 110 of the foldable display device 100.

In summary, the edges of the cover window 110, the polarizer 120, the display panel 130, the back plate unit 140, and the frame 150 slip by the stress applied at the time of folding and the sliding degree of the edges of the foldable display device 100 may vary by the radii of curvature of the components.

Further, as described above with reference to FIG. 4, when the foldable display device 100 is folded, the adhesive unit 160 disposed between components of the foldable display device 100 may be deformed. As the components slip, the adhesive layer of the adhesive unit 160 may extend along edges of the components and disperse or relieve the stress which is applied to the components at the time of folding. Further, when the adhesive unit 160 is deformed to be folded, propagation of the stress generated from each component to the other component may be relieved.

In the meantime, as the component above the adhesive unit 160 and the component below the adhesive unit 160 have different physical properties, the more slipping may occur. In this case, when the adhesiveness of the adhesive layer of the adhesive unit 160 is adjusted to cause more slipping, the stress may be relieved in accordance with a different level of the physical properties of the component above the adhesive layer and the component below the adhesive layer.

For example, when the first back plate 141 is formed of a rigid material, it is difficult for the first back plate 141 having the high rigidity, the high Young's modulus, and the low elasticity to flexibly extend at the time of folding the foldable display device 100. Further, the folding property of the foldable display device 100 may be lowered.

In contrast, when the second back plate 142 is formed of a soft material, the second back plate 142 having a low rigidity, a low Young's modulus, and a high elasticity flexibly extends and is easily folded at the time of folding the foldable display device 100. Therefore, the first back plate 141 is not flexibly deformed, but the second back plate 142 may be flexibly deformed, so that the slipping degree between the first back plate 141 and the second back plate 142 may be high.

The second adhesive unit 162 between the first back plate 141 and the second back plate 142 may have the adhesiveness which facilities the slipping between the first back plate 141 and the second back plate 142. That is, the second part 162b having a relatively weak adhesiveness is disposed in the vicinity of the edges of the first back plate 141 and the second back plate 142 at which the slipping starts to facilitate the slipping of the first back plate 141 and the second back plate 142 and relieve the stress.

As described above, as the adhesiveness of the adhesive unit 160 is stronger, the adhesive unit 160 acts to reduce the slipping degree of the components. However, the adhesiveness of the second part 162b of the second adhesive unit 162 is weak so that the slipping degree of the components above and below the second part 162b may be increased.

Therefore, the second adhesive unit 162 including the first part 162a and the second part 162b are disposed above and below the first back plate 141 which is formed of a rigid material so that when the foldable display device 100 is folded, the slipping may more easily occur. Further, the stress generated in the first back plate 141 is relieved to minimize the propagation of the stress to the other components.

Further, the second adhesive unit 162 is disposed on the frame 150 formed of a rigid material so that the slipping between the frame 150 and the second back plate 142 satisfactorily occurs. The second adhesive unit 162 relieves the stress generated in the frame 150 to minimize the propagation of the stress to other components.

Therefore, the second adhesive unit 162 is disposed between a component formed of a rigid material and a component which is not formed of a rigid material to reduce the stress caused in accordance with the folding of the rigid material. Specifically, when the second adhesive unit 162 is disposed between the component above the second adhesive unit 162 and the component below the second adhesive unit 162 in which the physical properties such as an elasticity, a rigidity, and a Young's modulus are very different, the slipping occurs well in the edge area and the stress is relieved.

In the foldable display device 100 according to one exemplary embodiment of the present disclosure, the second adhesive unit 162 including the first part 162a and the second part 162b having different adhesivenesses is disposed below the display panel 130 and a configuration having a higher rigidity than that of the display panel 130 is disposed below the second adhesive unit 162.

As the second adhesive unit 162 is disposed below the display panel 130, when the rigid material disposed below the display panel 130, for example, a component such as the frame 150 is disposed, the possible degradation of the folding property is improved and the reliability of the foldable display device 100 may be improved.

Referring to FIGS. 5A and 5B again, in the foldable display device 100 according to another exemplary embodiment of the present disclosure, an adhesive unit having the same adhesiveness, for example, the first adhesive unit 161 may be further disposed on the display panel 130.

The polarizer 120 and/or the cover window 110 which are fixed by the first adhesive unit 161 may be further disposed on the display panel 130 of the foldable display device 100.

The first adhesive unit 161 refers to at least one adhesive layer disposed on the display panel 130. Specifically, the first adhesive unit 161 may include adhesive layers which may be disposed between the display panel 130 and the polarizer 120 on the display panel 130 and between the polarizer 120 and the cover window 110.

The cover window 110 may protect the polarizer 120 and the display panel 130 below the cover window 110, from the impact, the moisture, heat, and the like, from the outside. The cover window 110 may be formed of a material having an impact resistance and optical transmittance. For example, the cover window 110 may be a substrate formed of glass or a thin film formed of a plastic material such as polymethylmethacrylate (PMMA), polyimide (PI), or polyethylene terephthalate (PET).

However, the material of the cover window 110 is not limited thereto and the cover window 110 may be a thin flexible glass. A thickness of the thin glass may be 5 μm to 10 μm and may have an etched surface to remove a crack or a chip on the surface.

In the meantime, the cover window 110 may be formed of a material having a high Young's modulus, that is, a material having a high hardness, to reduce the crack caused by the external impact. However, when the foldable display device 100 is folded, the material having a high Young's modulus is not bent, but may be broken. However, when even the material having a high Young's modulus has a thickness which is smaller than a predetermined thickness, the material is foldable. Therefore, the thickness of the cover window 110 may be very small. For example, the cover window 110 may be a thin plastic film or a thin glass, but is not limited thereto.

The polarizer 120 may be disposed below the cover window 110. The polarizer 120 may reduce the reflection of the external light. For example, the polarizer 120 may be a circular polarizer.

The display panel 130 includes various metals, organic and inorganic materials which are applied to the thin film transistor, the wiring line, the electroluminescent element, and the like. Therefore, the external light incident onto the display panel 130 may be reflected from the metal material so that the visibility of the foldable display device 100 may be reduced due to the reflection of the external light. Therefore, the polarizer 120 is disposed on one surface of the display panel 130 to absorb the external light. Therefore, the outdoor visibility of the foldable display device 100 may be increased.

In some exemplary embodiments, the touch panel may be further disposed on the display panel 130. The touch panel is a configuration which senses a touch input of the user such as a screen touch of the foldable display device 100 or a gesture and implemented by a capacitive type, and the like.

The first adhesive unit 161 may be formed by adhesive layers having the same adhesiveness. The first adhesive unit 161 may bond the entire display panel 130 and the entire polarizer 120 and the entire polarizer 120 and the entire cover window 110 to be completely adhered to each other, but is not limited thereto. When the display panel 130, the polarizer 120, and the cover window 110 are adhered to each other, a path difference of the light emitted from the display panel 130 is not generated. Further, the image disposed on the foldable display device 100 is not distorted.

When the adhesive layer having a similar function to the second adhesive unit 162 bonds the display panel 130 and the polarizer 120 and the cover window 110, the display panel 130 and the polarizer 120, and the polarizer 120 and the cover window 110 are not completely adhered, but partially loosened. Therefore, the path difference of the light emitted from the display panel 130 may be generated so that the quality of the image displayed on the foldable display device 100 may be degraded. Therefore, the first adhesive unit 161 may be desirably disposed on the display panel 130.

Additionally, the cover window 110 may be selected in accordance with a surface rigidity or a usage environment of the display panel 130. The polarizer 120 absorbs the external light so that the polarizer 120 may be selected in accordance with brightness of the display panel 130 or brightness of the external light in the usage environment.

As described above, the cover window 110 may have a very thin thickness to be foldable. The cover window 110 having a thin thickness may be deformed by the impact from the outside. That is, when the external impact is applied to the foldable display device 100 which is unfolded, the cover window 110 is deformed so that the surface of the cover window 110 may not be flat. When the flatness of the cover window 110 is lowered, a distorted image may be displayed, other components may be damaged, and the reliability of the foldable display device 100 may be reduced.

In the foldable display device 100 according to one exemplary embodiment of the present disclosure, a rigid structure is introduced below the display panel 130 to improve the rigidity of the foldable display device 100 and minimize the deformation of the cover window 110. Specifically, the back plate unit 140 in which at least one back plate is formed of a rigid material and/or the frame 150 formed of a rigid material is disposed below the display panel 130 to improve a phenomenon that the surface of the cover window 110 is deformed.

However, the rigid structure of the back plate unit 140 in which at least one back plate is formed of a rigid material and the frame 150 formed of a rigid material may apply a stress to the other configuration at the time of folding the foldable display device 100. Specifically, the plastic material having an elastic property may be flexibly deformed with respect to the stress applied at the time of folding so that a generated stress is relatively small. In contrast, since it is hard for the rigid material in which plastic-deformation hardly occurs to be flexibly deformed with respect to the stress applied at the time of folding, the generated stress is relatively high. Further, the stress generated from the rigid material may be transmitted to the other components through the adhesive unit 160. For example, the stress is applied to the display panel 130, the touch panel, the polarizer 120, the cover window 110, and the like disposed on the back plate unit 140 and the frame 150 so that the display panel 130, the touch panel, the polarizer 120, the cover window 110, and the like may be damaged.

Therefore, in the foldable display device 100 according to one exemplary embodiment of the present disclosure, the adhesiveness of at least one of the adhesive layers of the adhesive unit 160 is controlled to relieve the stress due to the rigid structure. For example, when the first back plate 141 and the frame 150 are formed of a rigid material, the second adhesive units 162 are disposed respectively above and below the first back plate 141 and above the frame 150 to facilitate the slipping. The second adhesive unit 162 is configured by the first part 162a and the second part 162b and the adhesiveness of the second part 162b is weaker than that of the first part 162a. In this case, the second part 162b is disposed to overlap the edge of the first back plate 141 and the edge of the frame 150 where the slipping occurs so as to facilitate the slipping between the display panel 130 and the first back plate 141 and between the first back plate 141 and the second back plate 142. Further, the second part 162b of the second adhesive unit 162 may facilitate the slipping between the frame 150 and the second back plate 142. Therefore, the slipping of the second part 162b of the second adhesive unit 162 is facilitated to relieve or reduce the propagation of the stress generated in the first back plate 141 and the frame 150 formed of a rigid material to the other component. Therefore, in the foldable display device 100 according to one exemplary embodiment of the present disclosure, the second part 162b of the second adhesive unit 162 is disposed at the edge where the slipping occurs so as to facilitate the slipping between components by the folding of the foldable display device 100 and relieve and reduce the stress generated from the configurations.

Figure 6:
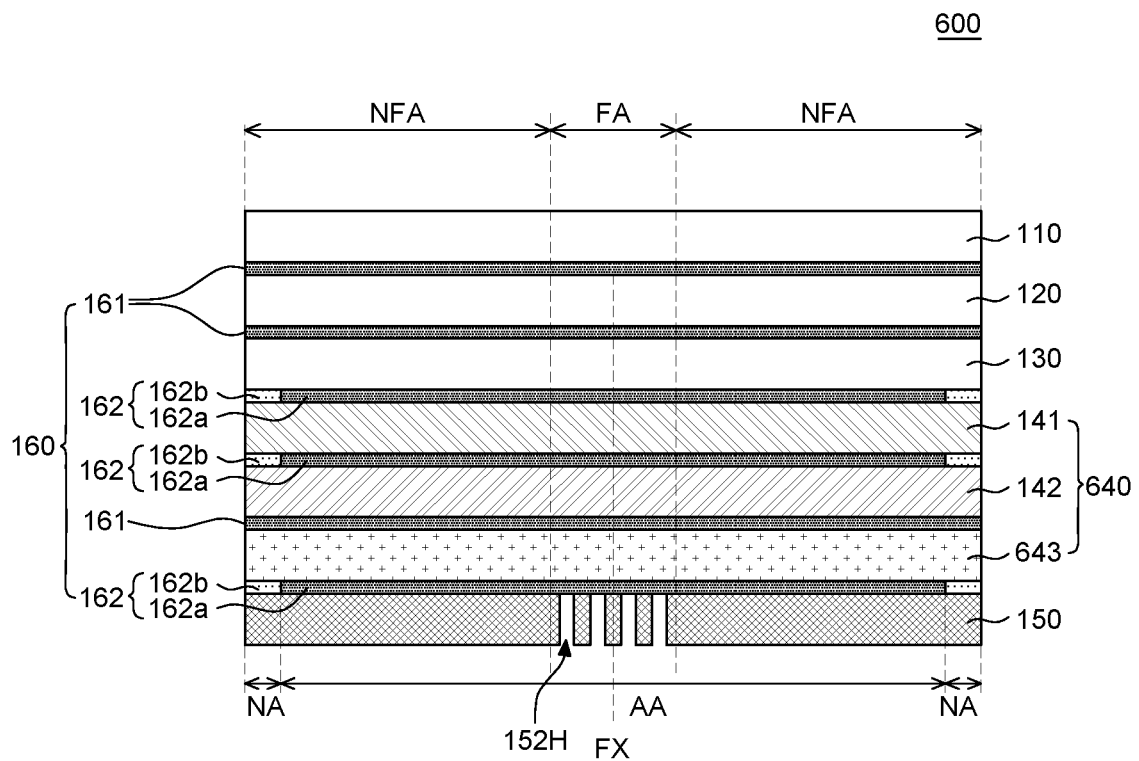
FIG. 6 is a cross-sectional view of a foldable display device according to still another exemplary embodiment of the present disclosure.

FIG. 6 is a cross-sectional view of a foldable display device according to still another exemplary embodiment of the present disclosure. As compared with the foldable display device 100 of FIGS. 1 to 4, a foldable display device 600 of FIG. 6 further includes a third back plate 643 but other configuration is substantially the same. Therefore, a redundant description will be omitted.

Referring to FIG. 6, the back plate unit 640 includes a first back plate 141, a second back plate 142, and a third back plate 643. Specifically, the first back plate 141 is disposed below the display panel 130, the second back plate 142 is disposed below the first back plate 141, and the third back plate 643 is disposed below the second back plate 142.

As the back plate unit 640 is formed by a multi-layered structure of the first back plate 141, the second back plate 142, and the third back plate 643, the rigidity and the impact resistance of the foldable display device 600 may be improved.

Some of the first back plate 141, the second back plate 142, and the third back plate 643 may be formed of the same material or all the first back plate 141, the second back plate 142, and the third back plate 643 may be formed of different materials. For example, the first back plate 141, the second back plate 142, and the third back plate 643 may be formed of materials having different Young's modulus. For example, some of the first back plate 141, the second back plate 142, and the third back plate 643 may be formed of a material having similar Young's modulus and the other may be formed of material having a different Young's modulus.

In this case, at least one of the first back plate 141, the second back plate 142, and the third back plate 643 is formed of a rigid material to further improve the rigidity and the impact resistance of the foldable display device 600.

In the meantime, when the second back plate 142 and the third back plate 643 are formed of a material having a similar Young's modulus, the adhesive layer disposed between the second back plate 142 and the third back plate 643 may be a first adhesive unit 161.

As described above, when the physical properties between a configuration above a specific adhesive layer and a configuration below the specific adhesive layer are very different, the second adhesive unit 162 configured by the first part 162a and the second part 162b is disposed to facilitate the slipping between configurations at the time of folding. Therefore, the damage of the foldable display device 600 may be minimized.

However, like the second back plate 142 and the third back plate 643, when the Young's modulus are not largely different but the physical properties are similar, even though the first adhesive unit 161 is disposed, the stress occurring at the time of folding and the damage problem of the foldable display device 600 may be solved.

Therefore, the foldable display device 600 according to another exemplary embodiment of the present disclosure may selectively dispose the first adhesive unit 161 and the second adhesive unit 162 in consideration of respective physical properties of the plurality of back plates of the back plate unit 640. The back plate unit 640 may be configured by at least two or more back plates and at least one of them is formed of a rigid material to improve the rigidity of the foldable display device 600 and minimize the deformation of the cover window 110. For example, the back plate unit 640 may be configured by the first back plate 141, the second back plate 142, and the third back plate 643. When the first back plate 141 is formed of a rigid material and the second back plate 142 and the third back plate 643 are formed of a material having a similar physical property, such as a soft material or a plastic material, the second adhesive unit 162 is disposed above and below the first back plate 141 to relieve the stress from the first back plate 141. In contrast, when only the first adhesive unit 161 is disposed on the second back plate 142 and the third back plate 643 having a similar physical property, instead of the second adhesive unit 162, the stress caused by the difference of the physical properties of the second back plate 142 and the third back plate 643 is not so large. Therefore, the stress may be relieved only by the first adhesive unit 161. Therefore, in the foldable display device 600 according to another exemplary embodiment of the present disclosure, even though a part of the back plate unit 640 is formed of a rigid material, the first adhesive unit 161 and the second adhesive unit 162 are selectively disposed to facilitate the slipping when the foldable display device 600 is folded. Therefore, the damage of the foldable display device 600 is minimized.

Figure 7:
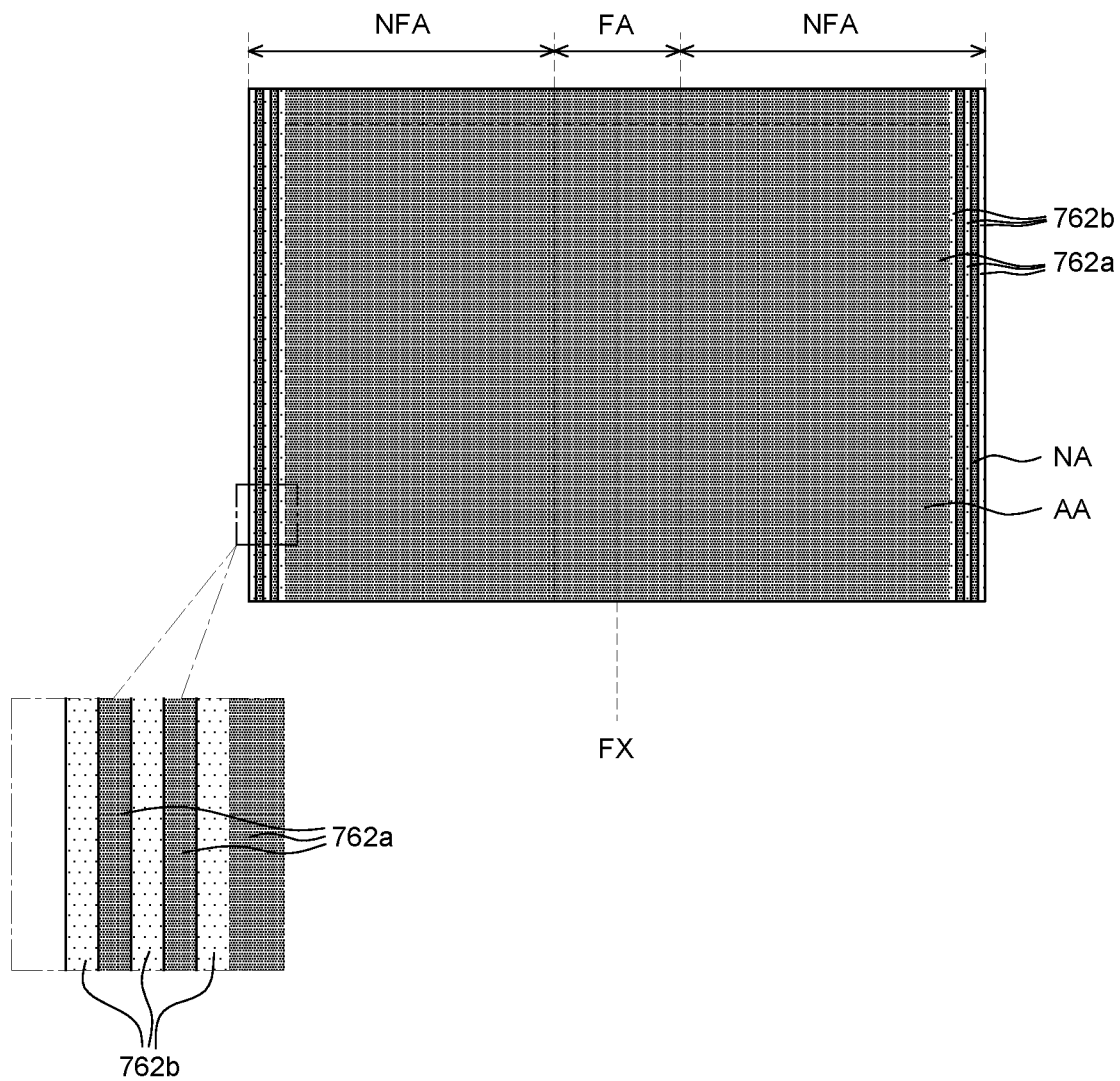
FIG. 7 is a plan view of a second adhesive unit of a foldable display device according to still another exemplary embodiment of the present disclosure.
Figure 8:
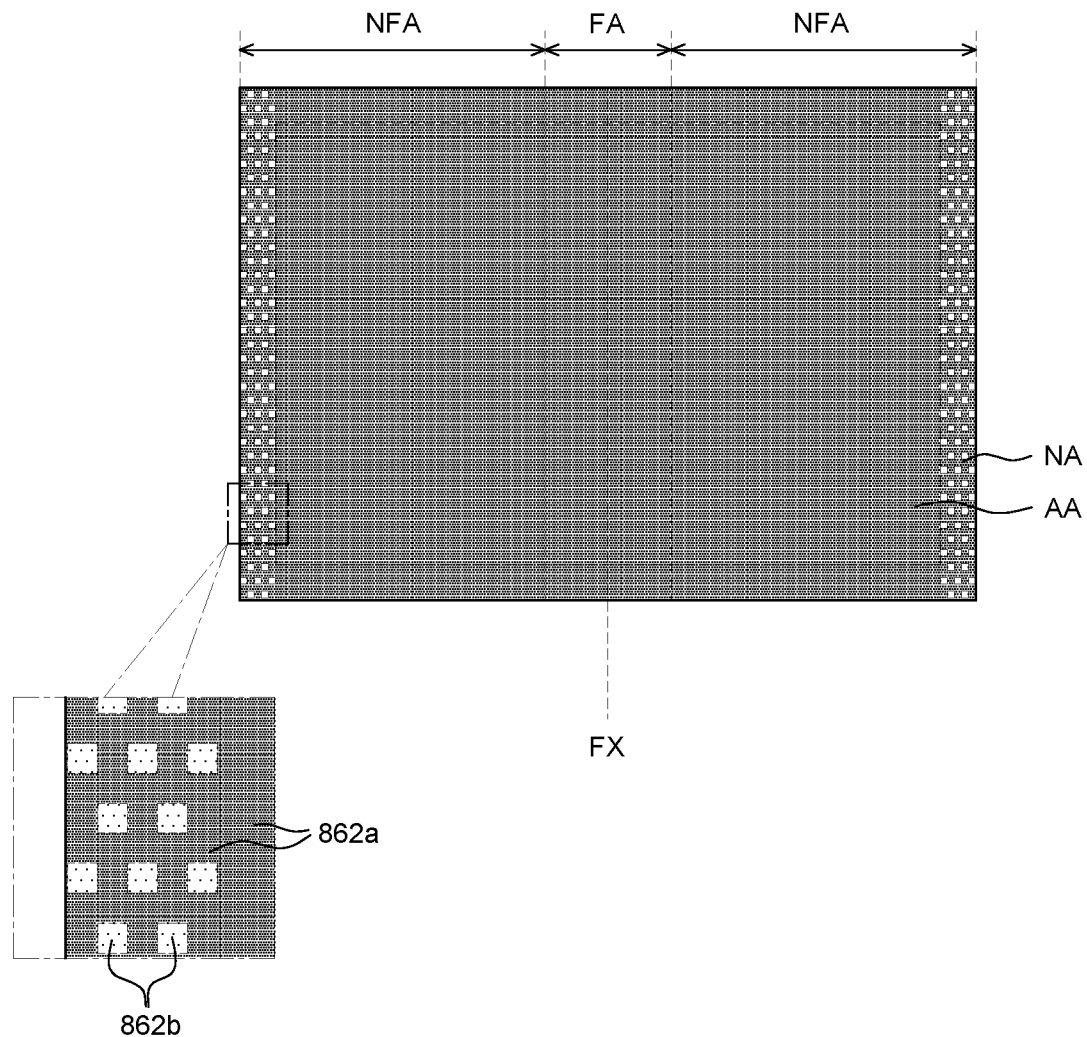
FIG. 8 is a plan view of a second adhesive unit of a foldable display device according to still another exemplary embodiment of the present disclosure.
Figure 9:
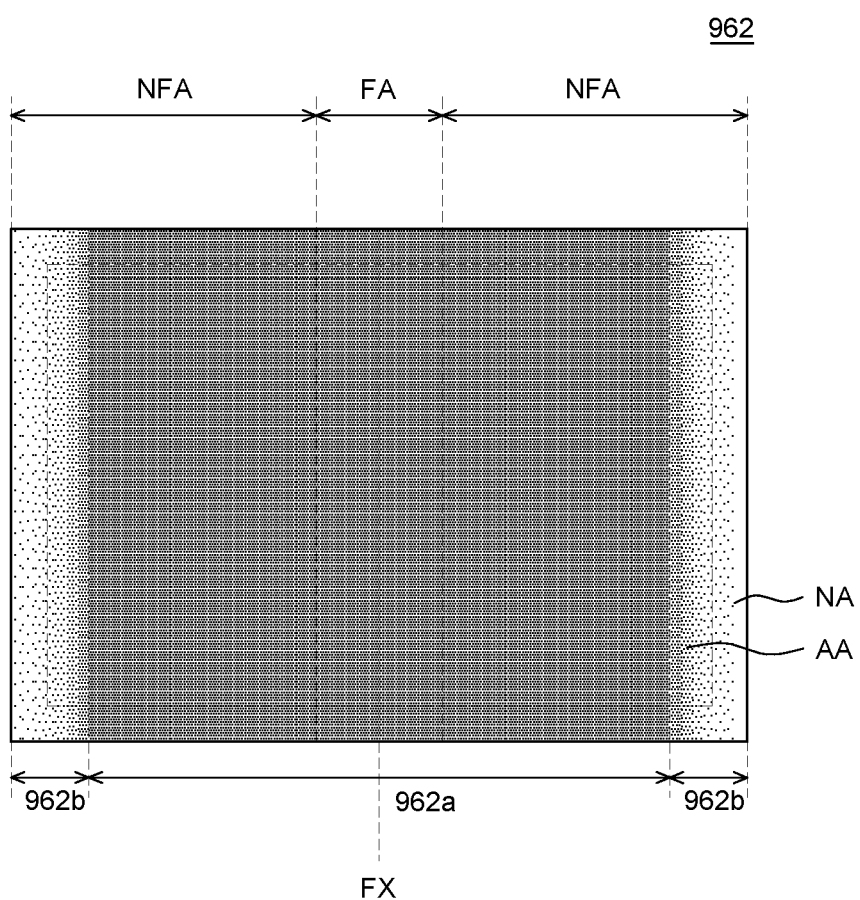
FIG. 9 is a plan view of a second adhesive unit of a foldable display device according to still another exemplary embodiment of the present disclosure.

FIG. 7 is a plan view of a second adhesive unit of a foldable display device according to still another exemplary embodiment of the present disclosure. FIG. 8 is a plan view of a second adhesive unit of a foldable display device according to still another exemplary embodiment of the present disclosure. FIG. 9 is a plan view of a second adhesive unit of a foldable display device according to still another exemplary embodiment of the present disclosure. As compared with the second adhesive unit 162 of FIG. 4, only second parts 762b, 862b, and 962b of second adhesive units 762, 862, and 962 of FIGS. 7 to 9 are different, but other configuration is substantially same. Therefore, a redundant description thereof will be omitted.

Referring to FIG. 7, the second part 762b of the second adhesive unit 762 includes a plurality of line patterns. That is, the second part 762b is formed of a plurality of line patterns. A long side of a plurality of line patterns which is a second part 762b extends to be parallel the folding axis FX of the folding area FA. That is, the line patterns may include a first side and a second side that is longer than the first side where the second side is parallel to the folding axis FX.

The plurality of line patterns of the second part 762b may be disposed to be spaced apart from each other. Specifically, the plurality of line patterns of the second part 762b may be disposed to be spaced apart from each other such that long sides are opposite to each other. Further, the first part 762a may be disposed between the plurality of line patterns of the second part 762b. Therefore, the first part 762a and the second part 762b are alternately disposed in a part of the non-folding area NFA.

In the meantime, even though in FIG. 7, it is illustrated that the plurality of line patterns of the second part 762b is disposed with an equal interval, the intervals of the plurality of line patterns may be gradually increased or reduced, but is not limited thereto.

Referring to FIG. 8, the second part 862b of the second adhesive unit 862 includes a plurality of dot patterns. That is, the second part 862b may be formed of a plurality of dot patterns.

The plurality of dot patterns of the second part 862b may be disposed to be spaced apart from each other. For example, each of the plurality of dot patterns of the second part 862b is disposed in the unit of a plurality of rows and a plurality of dot patterns disposed in one row may be alternately disposed with a plurality of dot patterns disposed in an adjacent row.

In the meantime, even though in FIG. 8, it is illustrated that the plurality of dot patterns of the second part 862b is disposed with an equal interval and dot patterns in adjacent rows are alternately disposed, the plurality of dot patterns of the second part 862b may be irregularly or regularly disposed, but is not limited thereto.

Further, even though in FIG. 8, the plurality of dot patterns of the second part 862b has a rectangular shape, the plurality of dot patterns may have various shapes such as a circular shape, a rhombic shape, or a dumbbell shape, but is not limited thereto.

Referring to FIG. 9, the second part 962b of the second adhesive unit 962 includes an edge pattern. That is, the second part 962b may be formed of an edge pattern.

The edge pattern of the second part 962b is a part of the non-active area NA and overlap a part of the active area AA. In this case, a part of the active area AA which overlaps the edge pattern of the second part 962b extends from the non-active area NA. Therefore, the second part 962b of the second adhesive unit 962 may be disposed to overlap not only the non-active area NA, but also the active area AA and the arrangement of the second part 962b may be changed in various forms depending on the design of the foldable display device.

The adhesiveness of the edge pattern of the second part 962b may be gradually reduced as the edge pattern is away from the folding area FA. That is, the adhesiveness in the edge pattern of the second part 962b may gradually vary in the form of gradation. In other words, an adhesiveness of the edge pattern of the second part 962b reduces as a distance between the edge pattern to the folding area FA increases. The adhesiveness in an area adjacent to a long side which is more adjacent to the folding area FA, among the long sides of the edge pattern of the second part 962b may be stronger than that in an area adjacent to the remaining long sides. The closer to the center portion of the second adhesive unit 962 from an edge at a short side of the second adhesive unit 962, the stronger the adhesiveness of the second part 962b.

The foldable display device according to still another exemplary embodiment of the present disclosure designs the second parts 762b, 862b, and 962b of the second adhesive units 762, 862, and 962 in various shapes to control the adhesiveness of the second adhesive units 762, 862, and 962. Specifically, the second parts 762b, 862b, and 962b of the second adhesive units 762, 862, and 962 may be configured by a plurality of line patterns, a plurality of dot patterns, and an edge pattern in which the adhesiveness gradually varies. For example, when the second part 762b is configured by a plurality of line patterns, the plurality of line patterns is spaced apart from each other to be adjacent to the edge of the second adhesive unit 762. When the second part 862b is configured by a plurality of dot patterns, the plurality of dot patterns is spaced apart from each other to be adjacent to the edge of the second adhesive unit 862. When the second part 962b is configured by an edge pattern, the adhesiveness in the edge pattern is gradually reduced as it is away from the first part 962a and the adhesiveness in an area adjacent to the edge of the second adhesive unit 962 may be the weakest. As the second parts 762b, 862b, and 962b are designed to have various shapes of patterns, the boundary of the first parts 762a, 862a, and 962a and the second parts 762b, 862b, and 962b may be smoothly formed without being conspicuous. Therefore, the adhesiveness from the first parts 762a, 862a, 962a of the second adhesive units 762, 862, and 962 to the second parts 762b, 862b, and 962b may not be rapidly lowered. Therefore, when the foldable display device is folded, the slipping between the configuration above the second adhesive units 762, 862, and 962 and the configuration below the second adhesive units 762, 862, and 962 is facilitated and the detachment between the configurations above and below the second adhesive units 762, 862, and 962 in the second parts 762b, 862b, and 962b may be minimized. Therefore, the foldable display device according to another exemplary embodiment of the present disclosure facilitates the slipping at the time of folding while suppressing the detachment of configurations above and below the second adhesive units 762, 862, and 962 from the second adhesive units 762, 862, and 962. Therefore, it is possible to relieve the stress of the foldable display device and minimize the damage of the foldable display device.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A foldable display device, comprising:
   a display panel including a folding area and a non-folding area, the display panel configured to fold in the folding area and not configured to fold in the non-folding area;
   a back plate unit comprising a plurality of back plates, the back plate unit disposed under the display panel; and
   a plurality of adhesive layers disposed between the display panel and the back plate unit, and between the plurality of back plates,
   wherein at least some of the plurality of adhesive layers includes a first adhesive part and a second adhesive part, the second adhesive part less adhesive than the first adhesive part.

2. The foldable display device according to claim 1, wherein the first adhesive part overlaps the folding area and the non-folding area, and the second adhesive part overlaps the non-folding area without overlapping the folding area.

3. The foldable display device according to claim 2, wherein the first adhesive part overlaps the folding area and a part of the non-folding area that is adjacent to the folding area.

4. The foldable display device according to claim 1, wherein the display panel includes an active area that display an image and a non-active area that does not display the image, the non-active area surrounding the active area; and
   wherein the second adhesive part overlaps a first portion of the non-active area that is adjacent to a first end of the active area and a second portion of the non-active area that is adjacent to a second end of the active area that is opposite the first end of the active area.

5. The foldable display device according to claim 4, wherein the second adhesive part further overlaps at least a portion of the active area that extends from the non-active area.

6. The foldable display device according to claim 1, wherein the second adhesive part includes an edge pattern having a first side and a second side that is longer than the first side, the second side parallel to a folding axis of the folding area.

7. The foldable display device according to claim 6, wherein an adhesiveness of the edge pattern reduces as a distance between the edge pattern to the folding area increases; and
   wherein an adhesiveness of a third side of the edge pattern that is parallel to the second side is greater than an adhesiveness of the second side of the edge pattern, the third side closer to the folding area than the second side.

8. The foldable display device according to claim 1, wherein the second adhesive part includes a plurality of line patterns, each of the plurality of line patterns spaced apart from another one of the plurality of line patterns; and
   wherein each of the plurality of line patterns includes a first side and a second side that is longer than the first side, the second side of each of the plurality of line patterns parallel to a folding axis of the folding area.

9. The foldable display device according to claim 1, wherein the second adhesive part includes a plurality of dot patterns, each of the plurality of dot patterns spaced apart from another one of the plurality of dot patterns.

10. The foldable display device according to claim 1, further comprising:
    a frame disposed below the back plate unit, the frame including a plurality of openings that overlap the folding area without overlapping the non-folding area.

11. The foldable display device according to claim 10, wherein the plurality of adhesive layers includes an adhesive layer disposed between the back plate unit and the frame, the adhesive layer between the back plate unit and the frame including the first adhesive part and the second adhesive part.

12. The foldable display device according to claim 1, wherein the plurality of back plates include include a first back plate and a second back plate having different Young's moduli,
    wherein an adhesive layer from the plurality of adhesive layers is disposed between the first back plate and the second back plate, the adhesive layer between the first back plate and the second back plate including the first adhesive part and the second adhesive part.

13. The foldable display device according to claim 1, wherein edges of the display panel and the plurality of back plates are not aligned while the foldable display device is folded, and the edges of the display panel and the plurality of back plates are aligned while the foldable display device is not folded.

14. The foldable display device according to claim 13, wherein an edge of the back plate unit is more inset than an edge of the display panel while the foldable display device is in-folded, and
    wherein the edge of the display panel is more inset than the edge of the back plate unit while the foldable display device is out-folded.

15. A foldable display device, comprising:
    a display panel configured to be folded with respect to a folding axis;
    a back plate unit disposed on the display panel, the back plate unit comprising a plurality of back plates;
    a frame disposed on the back plate unit; and
    a plurality of adhesive layers disposed between the display panel and the back plate unit, between the plurality of back plates, and between the back plate unit and the frame,
    wherein an adhesiveness at an edge portion of the plurality of adhesive layers is less adhesive than an adhesiveness of a portion of the plurality of adhesive layers at the folding axis.

16. The foldable display device according to claim 15, wherein a cross-linking density of the portion at the folding axis is different from a cross-linking density of the edge portion.

17. The foldable display device according to claim 15, wherein the display panel is configured by a visible area that display an image and a non-visible area that does not display the image,
    wherein the folding axis overlaps the visible area and the edge portion overlaps the non-visible area.

18. A foldable display device, comprising:
    a display panel including a folding area and a non-folding area, the display panel configured to fold in the folding area and not configured to fold in the non-folding area;
    a back plate unit below the display panel; and
    one or more adhesive layers disposed between the display panel and the back plate unit,
    wherein at least some of the one or more adhesive layers include a first adhesive part and a second adhesive part, the second adhesive part less adhesive than the first adhesive part.

19. The foldable display device according to claim 18, wherein the first adhesive part at least overlaps the folding area, and the second adhesive part overlaps the non-folding area without overlapping the folding area.

20. The foldable display device according to claim 18, wherein edges of the display panel and the back plate are not aligned while the foldable display device is folded, and the edges of the display panel and the back plate are aligned while the foldable display device is not folded.

* * * * *